(12) United States Patent
Fukuoka

(10) Patent No.: US 7,612,594 B2
(45) Date of Patent: Nov. 3, 2009

(54) LATCH CIRCUIT AND SEMICONDUCTOR INTEGRATED CIRCUIT HAVING THE SAME

(75) Inventor: Kouhei Fukuoka, Osaka (JP)

(73) Assignee: Panasonic Corporation, Osaka (JP)

( * ) Notice: Subject to any disclaimer, the term of this patent is extended or adjusted under 35 U.S.C. 154(b) by 69 days.

(21) Appl. No.: 11/889,821

(22) Filed: Aug. 16, 2007

(65) Prior Publication Data
US 2008/0048744 A1 Feb. 28, 2008

(30) Foreign Application Priority Data
Aug. 25, 2006 (JP) ............................. 2006-229513

(51) Int. Cl.
*H03K 3/00* (2006.01)
(52) U.S. Cl. .................. 327/215; 327/200; 327/202; 327/208; 327/214
(58) Field of Classification Search .......... 327/199–223
See application file for complete search history.

(56) References Cited

U.S. PATENT DOCUMENTS

| | | | | |
|---|---|---|---|---|
| 4,797,576 A | * | 1/1989 | Asazawa .................... 327/215 |
| 5,111,489 A | * | 5/1992 | Tanaka et al. ................ 377/121 |
| 5,140,179 A | * | 8/1992 | Takano ........................ 327/203 |
| 5,467,038 A | * | 11/1995 | Motley et al. ................ 327/185 |
| 6,211,713 B1 | * | 4/2001 | Uhlmann ..................... 327/211 |
| 6,504,412 B1 | | 1/2003 | Vangal et al. |
| 6,621,318 B1 | * | 9/2003 | Burr ............................ 327/218 |
| 6,864,733 B2 | * | 3/2005 | Anshumali et al. .......... 327/210 |
| 6,922,094 B2 | * | 7/2005 | Arima et al. ................. 327/208 |

FOREIGN PATENT DOCUMENTS

JP  2003-273709  9/2003
JP  2007328864 A * 12/2007

* cited by examiner

*Primary Examiner*—Lincoln Donovan
*Assistant Examiner*—Patrick O'Neill
(74) *Attorney, Agent, or Firm*—McDermott Will & Emery LLP

(57) ABSTRACT

A latch circuit includes first, second, and third inverter circuits, a switching element, and a capacitor element. The first inverter circuit and the second inverter circuit are cross-connected to each other. The third inverter circuit logically inverts an output from the first inverter circuit. The switching element is connected between the output terminal of the second inverter circuit and the output terminal of the third inverter circuit. The capacitor element is connected between the output terminal of the third inverter circuit and a reference voltage node.

18 Claims, 9 Drawing Sheets

LATCH CIRCUIT AND SEMICONDUCTOR INTEGRATED CIRCUIT HAVING THE SAME

BACKGROUND OF THE INVENTION

1. Field of the Invention

The present invention relates to a latch circuit, in particular, a technique which stably holds data in a latch circuit.

2. Description of the Related Art

In a conventional circuit such as an SRAM or a cache which is required to be highly integrated, data breakdown caused by an α radiation, a neutron radiation, or the like is viewed as a problem because the capacitance of a storage node is small. This problem is called a soft error. On the other hand, a latch circuit has a storage node having a relatively large capacitance, the soft error is not viewed as a serious problem up to now. However, with miniaturization of recent semiconductor devices, the capacitance of a storage node in a latch circuit tends to decrease, and resistance to a soft error is necessarily improved even in the latch circuit.

From a viewpoint of reduction in power consumption, a countermeasure such as a reduction in drive voltage is taken when the circuit is not operated. However, since the reduction in voltage causes a decrease in number of electric charges accumulated in the storage node of the latch circuit, data may be inverted by a small fluctuation of electric charge caused by power supply noise or the like.

As a countermeasure against a soft error, the following technique is publicly known. That is, data are held in a plurality of storage nodes, and, when one of the data is inverted, the inverted data is recovered by using the data in the remaining storage nodes. As a countermeasure against a soft error or a reduction in voltage, the following technique is publicly known. A capacitor element is connected to a storage node to increase the capacitance of the storage node in the latch circuit.

In the former, when a degree of integration of a semiconductor circuit further increases, a plurality of storage nodes are closely arranged. For this reason, the plurality of storage nodes are exposed to radiation to invert data even though an irradiation range of radiation is local, and normal data is in danger of being recovered. Furthermore, in a circuit configuration, data inversion caused by noise generated by a reduction in voltage still remains as a problem.

In the latter, although a countermeasure against a soft error and a reduction in voltage is taken, when logics of values held in a storage node and a capacitor element are different from each other, charge sharing occurs when the storage node and the capacitor element are connected to each other. For this reason, the value of the storage node becomes an intermediate potential, data may be inverted.

SUMMARY OF THE INVENTION

In consideration of the above problems, the present invention has as its object to stably hold data without causing charge sharing between a storage node and a capacitor element in a latch circuit.

In order to solve the problem, a device, serving as a latch circuit, made by the present invention includes: first and second inverter circuits cross-connected to each other as a latch circuit; a third inverter circuit for receiving an output from the first inverter circuit to output a logically inverted value of the output; a switching element connected between an output terminal of the second inverter circuit and an output terminal of the third inverter circuit; and a capacitor element connected between the output terminal of the third inverter circuit and a reference voltage node. According to this, the capacitor element is connected to the output terminal of the second inverter circuit serving as a storage node through the switching element to increase the capacitance of the storage node. For this reason, data can be stably held. Furthermore, although an output value from the third inverter circuit is held in the capacitor element, the output value is equal to the output value from the second inverter circuit. When the switching element is turned on, charge sharing does not occur between the output terminal of the second inverter circuit and the capacitor element.

Preferably, the latch circuit includes: a fourth inverter circuit for receiving an output from the second inverter circuit to output a logically inverted value of the output; a switching element connected between the output terminal of the first inverter circuit and an output terminal of the fourth inverter circuit; and a capacitor element connected between the output terminal of the fourth inverter circuit and the reference voltage node. According to this, increases in capacitance of the output terminals of both the first and second inverter circuits and charge sharing of the first and second inverter circuits are suppressed, and data is stably held in the latch circuit.

More specifically, the third inverter circuit is a tristate inverter circuit. More specifically, the switching element is a MOS transistor switch or a transfer gate. More specifically, the capacitor element is a trench capacitor element or a MOS capacitor.

More preferably, the capacitor element is arranged to fill an empty space in a semiconductor integrated circuit having the latch circuit. In this manner, a degree of integration of the circuit can be increased.

Still more preferably, a semiconductor integrated circuit includes: the latch circuit, a clock gate circuit for controlling the presence/absence of outputting of an input clock signal on the basis of a control signal; and an input control circuit for controlling the presence/absence of inputting of a data signal to the latch circuit in synchronism with an output signal from the clock gate circuit. In this case, the switching element in the latch circuit operates in response to the control signal inputted to the clock gate circuit. In this manner, the control signal of the clock gate circuit and the control signal of the switching element can be commonly used.

Still more preferably, a semiconductor integrated circuit includes: the latch circuit; and a switching control circuit for controlling a switching operation of the switching element in synchronism with switching of operation frequencies or operation voltages of the latch circuit. According to this, under predetermined operation conditions, data can be stably held.

Still more preferably, a semiconductor integrated circuit includes: the latch circuit; and a switching control circuit for detecting switching of operation voltages of the latch circuit to control the switching element to an ON state during a switching period. According to this, the capacitance of the storage node is controlled to be increased during the period for switching the operation voltages of the latch circuit. For this reason, the circuit is not easily affected by coupling noise caused by a coupling capacitance parasitized in a portion for receiving an operation voltage, and data can be stably held.

DESCRIPTION OF THE PREFERRED EMBODIMENTS

Best modes for carrying out the present invention will be described below with reference to the accompanying drawings.

First Embodiments

Figure 1:
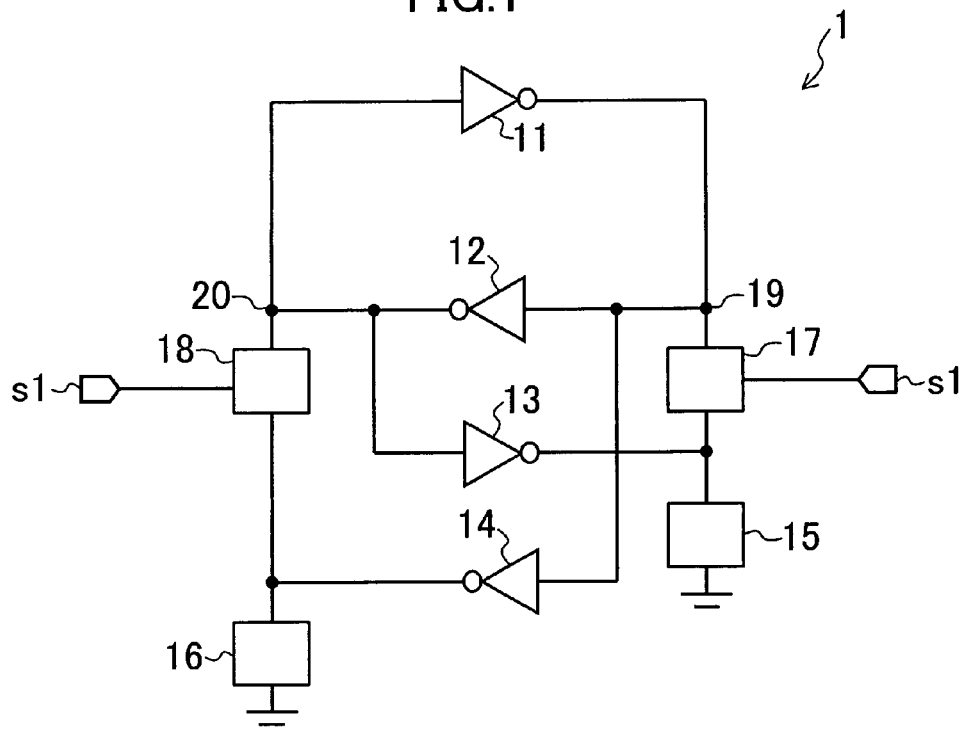
FIG. 1 is a diagram showing an example of a configuration of a latch circuit according to a first embodiment.

FIG. 1 shows an example of a configuration of a latch circuit according to a first embodiment. A latch circuit 1 includes inverter circuits 11, 12, 13, and 14, capacitor elements 15 and 16, and switching elements 17 and 18. The latch circuit 1 holds data in storage nodes 19 and 20 serving as connection points of the inverter circuit 11 and 12 which are cross-connected to each other. A configuration to hold data is not limited to the above configuration.

Figure 13:
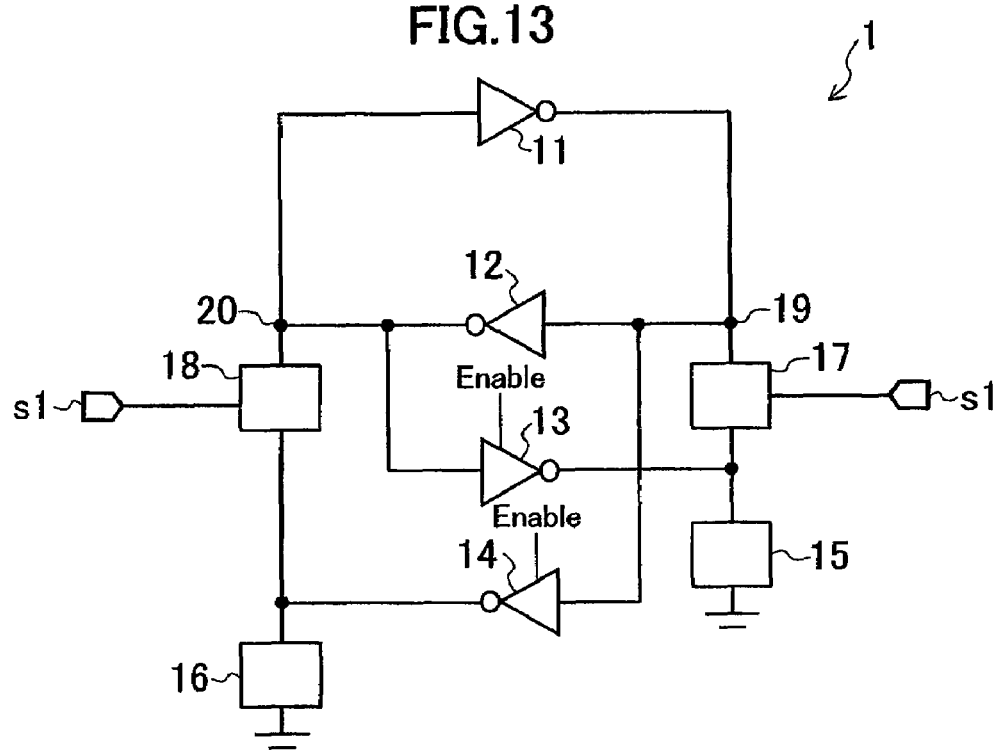
FIG. 13 is a diagram showing another example of a configuration of a latch circuit according to a first embodiment.

The inverter circuits 13 and 14 receive outputs from the inverter circuits 12 and 11, logically invert the outputs to output the logically inverted outputs, respectively. The inverter circuits 13 and 14 may be tristate inverter circuits (see, FIG. 13). In the tristate inverter circuit, an output can have a high impedance. For this reason, charging/discharging at the output terminal of the tristate inverter circuit can be suppressed, and a power consumption can be reduced.

The capacitor elements 15 and 16 are connected between an output terminal of the inverter circuit 13 and a reference voltage node and between an output terminal of the inverter circuits 14 and the reference voltage node and store values output from the inverter circuits 13 and 14, respectively. More specifically, values stored in the capacitor element 15 and the storage node 19 are equal to each other, and values stored in the capacitor element 16 and the storage node 20 are equal to each other. The reference voltage node may have a power supply voltage or a ground voltage.

Figure 14:
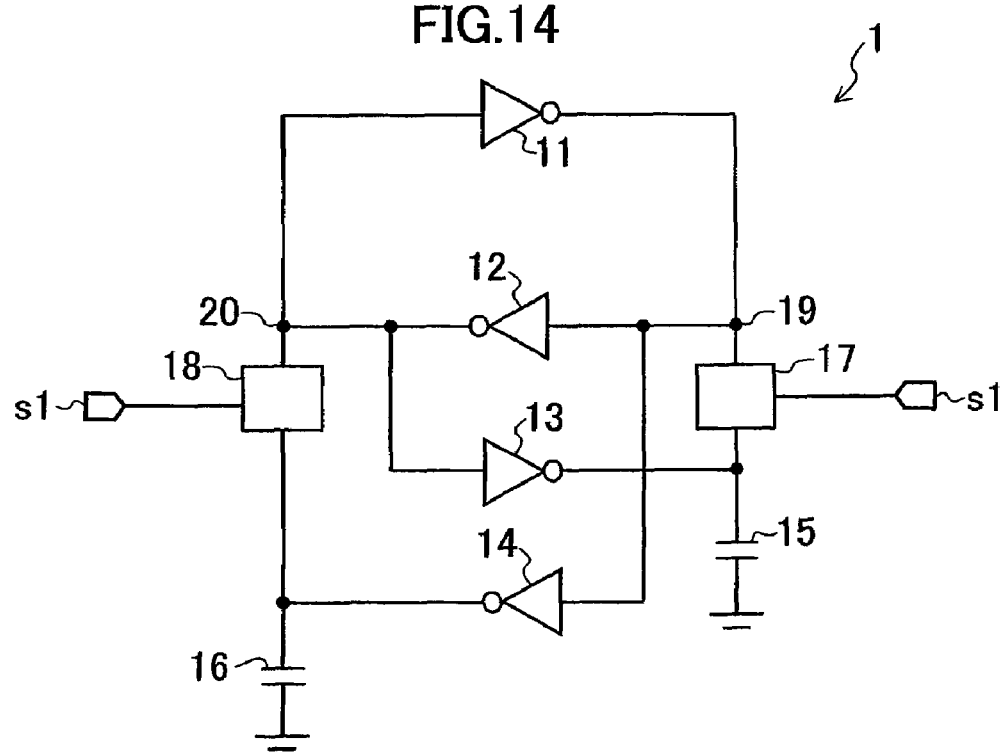
FIG. 14 is a diagram showing another example of a configuration of a latch circuit according to a first embodiment.
Figure 15:
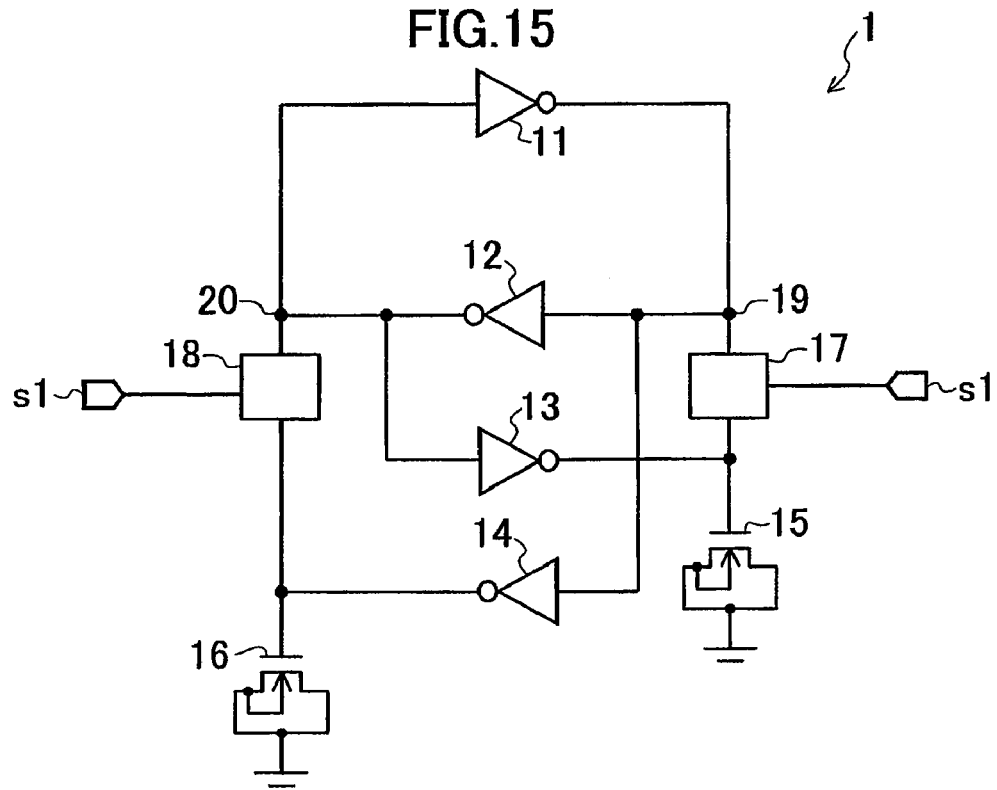
FIG. 15 is a diagram showing another example of a configuration of a latch circuit according to a first embodiment.

The capacitor elements 15 and 16 may be trench capacitors (see, FIG. 14). When the capacitor elements 15 and 16 are constituted by the trench capacitors, capacitors each having a small area and a large capacitance can be formed. The capacitor elements 15 and 16 may be MOS capacitors (see, FIG. 15). The MOS capacitors are capacitors in each of which source and drain terminals are short-circuited to be one terminal and a gate terminal is used as the other terminal. When the capacitor elements 15 and 16 are constituted by the MOS capacitors, the capacitors can be formed by the same process as that for a flip-flop circuit or a latch circuit. For this reason, the cost can be reduced.

Preferably, the capacitor elements 15 and 16 are arranged to fill a dead space generated when cells are arranged on the semiconductor integrated circuit. In general, space cells are often arranged to fill the dead space. However, capacitors are arranged by using the space to make it possible to constitute the latch circuit according to the embodiment without increasing a circuit scale.

The switching elements 17 and 18 are connected between the storage node 19 and the capacitor element 15 and between the storage node 20 and the capacitor element 16, respectively. Switching operations of the switching elements 17 and 18 are controlled by a control signal s1. More specifically, the switching element 17 is turned on when the logical level of the control signal s1 goes to "H", and electrically connects the storage node 19 and the capacitor element 15 to each other. The switching element 17 is turned off when the logical level of the control signal s1 goes to "L", and electrically blocks the storage node 19 from the capacitor element 15. The same operations as described above are performed to the switching element 18.

Figure 16:
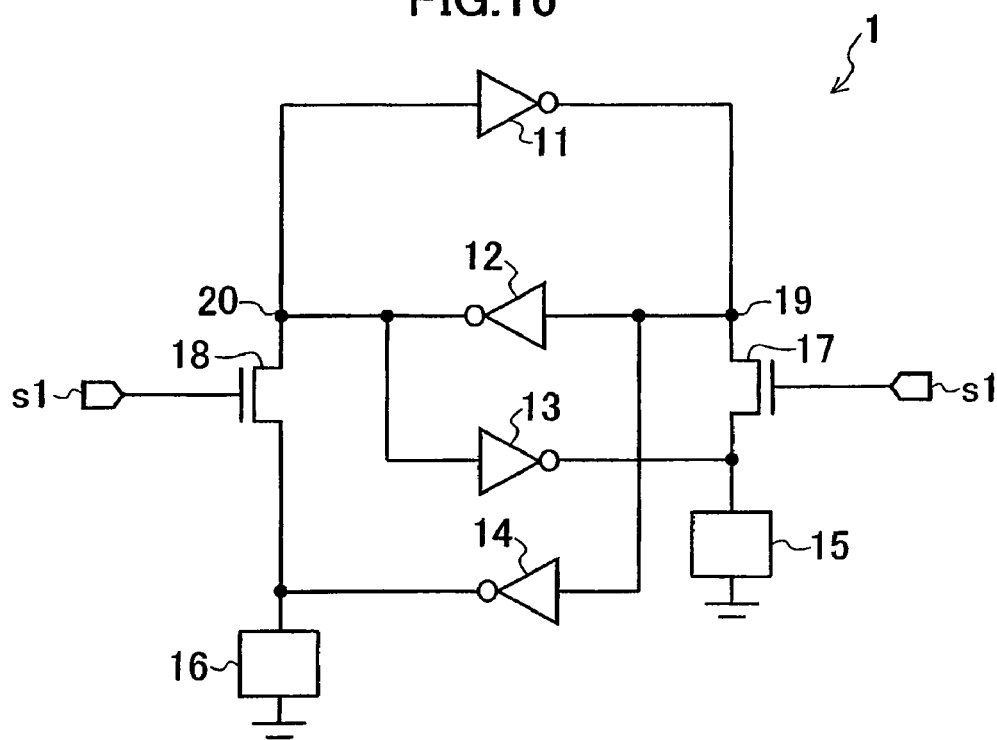
FIG. 16 is a diagram showing another example of a configuration of a latch circuit according to a first embodiment.

The switching elements 17 and 18 may be MOS transistor switches (see, FIG. 16). In the MOS transistor switch, a source terminal is used as one terminal, a drain terminal is used as the other terminal, and a gate terminal receives a control signal. The switching elements 17 and 18 are constituted by MOS transistors to make it possible to realize the switching elements with a small area.

Figure 17:
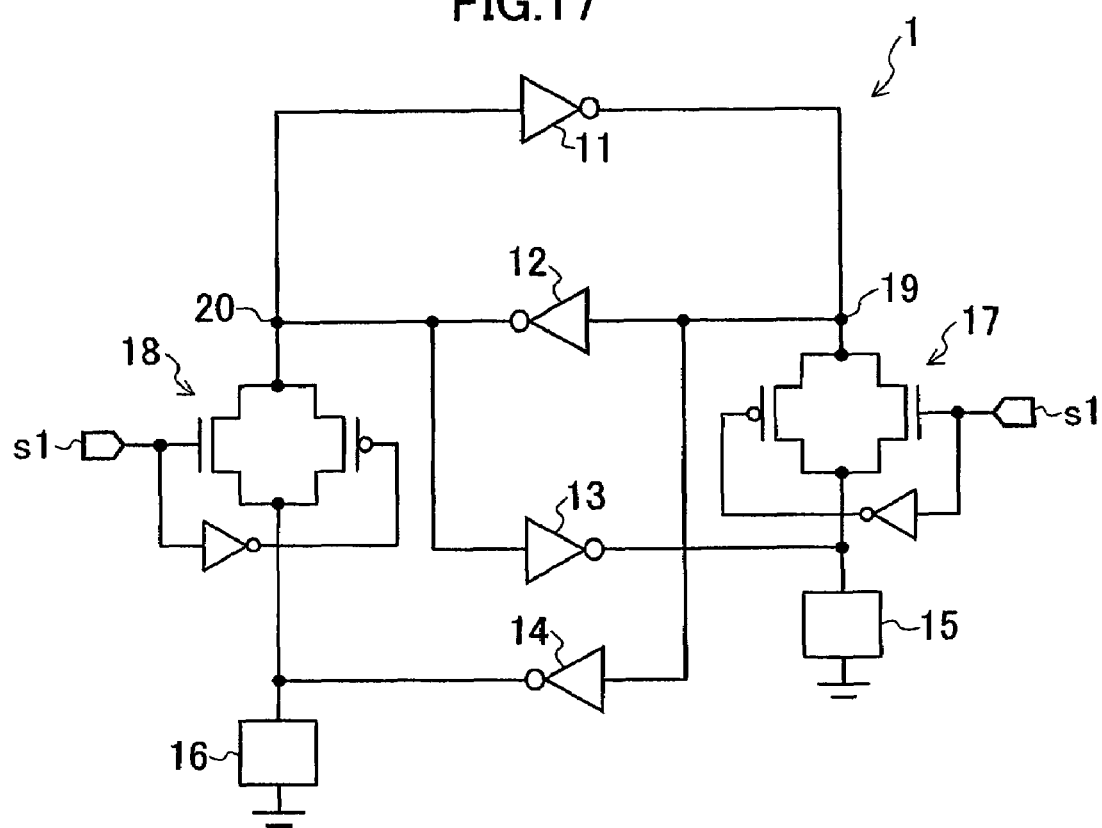
FIG. 17 is a diagram showing another example of a configuration of a latch circuit according to a first embodiment.

The switching elements 17 and 18 may be transistor gates (see, FIG. 17). The transfer gate is constituted by an nMOS transistor and a pMOS transistor connected such that each source terminal and each drain terminal are connected to each other. Control signals having inverse logical control signals are given to the gate electrodes of the nMOS transistor and the pMOS transistor, respectively. The switching elements 17 and 18 are constituted by the transfer gates to make it possible to connect the storage nodes 19 and 20 and the capacitor elements 15 and 16 with a low resistance. For this reason, a fluctuation caused by noise can be rapidly suppressed, and data inversion can be prevented from easily occurring.

According to the embodiment, when the switching element connected between the storage node and the capacitor element is turned on, the capacitance of the storage node increases. For this reason, resistances to a soft error and noise become high, and data can be stably held. Furthermore, when the switching element is turned on, charge sharing does not occur between the storage node and the capacitor element. Therefore, the circuit operation is stabilized, and the circuit is improved in reliability.

The inverter circuit 14, the capacitor element 16, and the switching element 18 may be omitted. The switching elements 17 and 18 may be controlled by different control signals, respectively. When the switching elements are independently controlled, three states including a state in which a capacitor element is not connected to the storage node, a state in which only one capacitor element is connected to the storage node, and a state in which two capacitor elements are connected to the storage node can be switched.

The storage node 19 and the capacitor element 15 may be connected to each other by a buffer circuit, and the storage node 20 and the capacitor elements 16 may be connected to each other by a buffer circuit. Even in this configuration, since logical values held by a storage node and a capacitor element connected to the storage node are equal to each other, the same effect as described above can be obtained.

Second Embodiment

Figure 2:
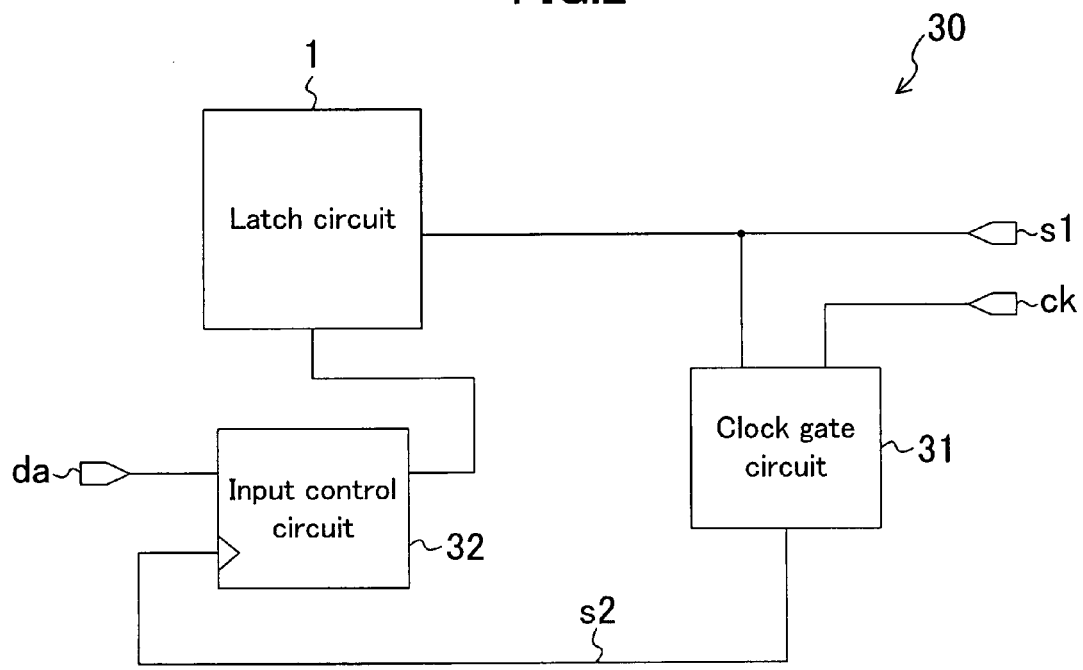
FIG. 2 is a diagram showing an example of a configuration of a semiconductor integrated circuit according to a second embodiment.

FIG. 2 shows an example of a configuration of a semiconductor integrated circuit according to a second embodiment. A semiconductor integrated circuit 30 includes the latch circuit 1 described above, a clock gate circuit 31, and an input control circuit 32.

The clock gate circuit 31 receives the control signal s1 of the switching elements 17 and 18 to control the presence/absence of outputting of an input clock signal ck on the basis of the control signal s1. In other words, by a control signal used in clock gated, the switching elements 17 and 18 are controlled. The input control circuit 32 controls the presence/absence of inputting of a data signal da to the latch circuit 1 in synchronism with an output signal s2 from the clock gate circuit 31. More specifically, the logical level of the signal s1 is set at "H" to instruct the discontinuation of the clock signal ck. At this time, since the clock gate circuit 31 transmits the clock signal ck, the input control circuit 32 does not operate. More specifically, the switching elements 17 and 18 are controlled such that the capacitances of the storage nodes increase when the latch circuit 1 is in a standby state.

With the above configuration, the control signal of the clock gate circuit 31 and the control signals of the switching elements 17 and 18 can be commonly used.

Third Embodiment

Figure 3:
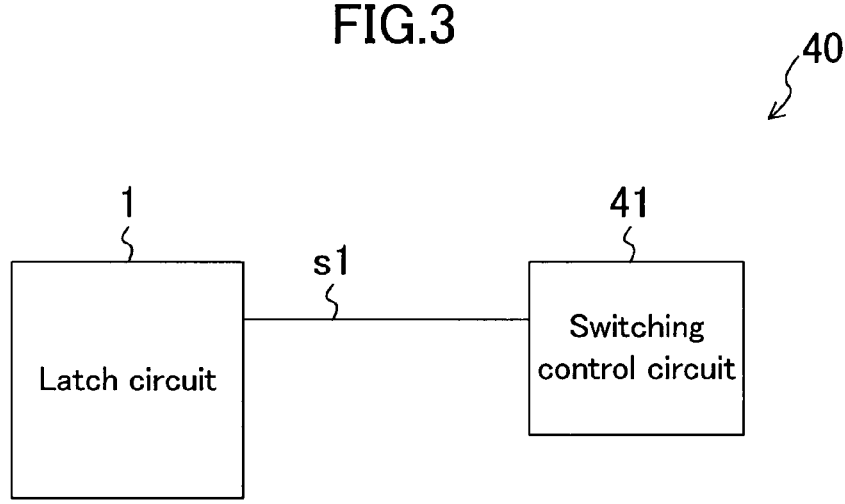
FIG. 3 is a diagram showing an example of a configuration of a semiconductor integrated circuit according to a third embodiment.

FIG. 3 shows an example of a configuration of a semiconductor integrated circuit according to a third embodiment. A semiconductor integrated circuit 40 includes the latch circuit 1 described above and a switching control circuit 41. The switching elements 17 and 18 are controlled by a control signal s1 output from the switching control circuit 41. An example of control of the semiconductor integrated circuit according to the embodiment will be described below.

First Example Of Control

Figure 4:
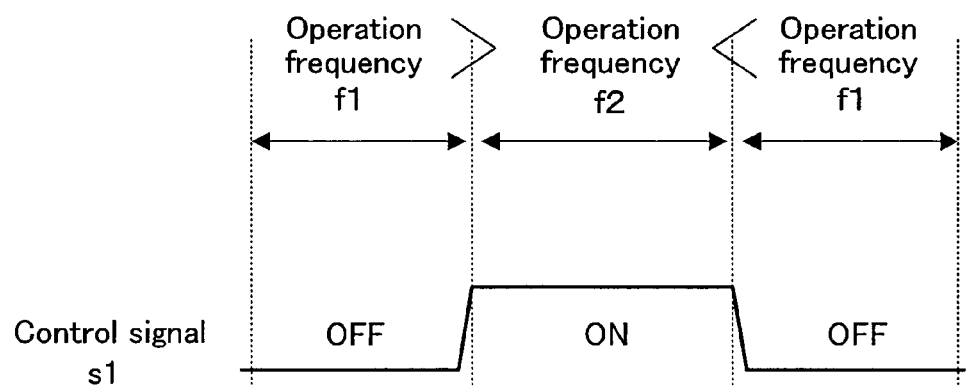
FIG. 4 is a diagram showing a first control example of the semiconductor integrated circuit according to the third embodiment.

FIG. 4 shows a first example of control of the latch circuit 1. The switching control circuit 41 sets the logical level of the control signal s1 at "H" when an operation frequency of the latch circuit 1 is switched from f1 to f2, and controls the switching element to an ON state. On the other hand, when the operation frequency of the latch circuit 1 is switched from f2 to f1, the switching control circuit 41 sets the logical level of the control signal s1 at "L" to control the switching element to an OFF state. In this manner, the following control can be performed. That is, for example, during a period of the operation frequency f1 at which the latch circuit 1 operates for a purpose of a high-speed operation speed rather than stable holding of data, the switching element is set in an OFF state to realize a high-speed operation. On the other hand, during a period of the operation frequency f2 at which the latch circuit 1 operates for a purpose of stable holding of data rather than a high-speed operation, the switching element is set in an ON state to stably hold data.

Second Example Of Control

Figure 5:
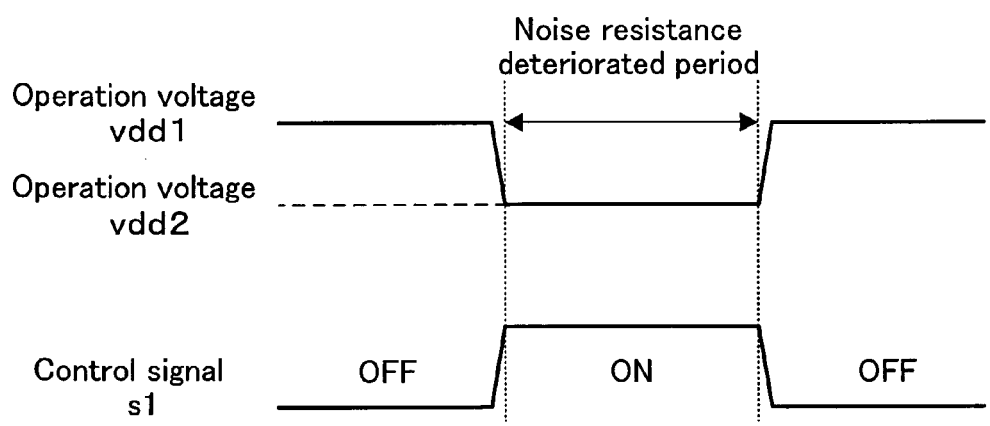
FIG. 5 is a diagram showing a second control example of the semiconductor integrated circuit according to the third embodiment.

FIG. 5 shows a second example of control of the latch circuit 1. When the operation voltage of the latch circuit 1 is switched from vdd1 to vdd2, the switching control circuit 41 sets the logical level of the control signal s1 at "H" to control the switching element to an ON state. On the other hand, when the operation voltage of the latch circuit 1 is switched from vdd2 to vdd1, the switching control circuit 41 sets the logical level of the control signal s1 at "L" to control the switching element to an OFF state. In this manner, during a period of the operation voltage Vdd2 at which noise resistance is deteriorated due to a low voltage, the switching element is controlled to the ON state to increase the capacitance of the storage node, so that data can be stably held. A timing at which the switching element is set in the ON state may be a timing before the operation voltages are switched if the circuit operation can be performed even though the capacitance of the storage node increases.

Third Example Of Control

Figure 6:
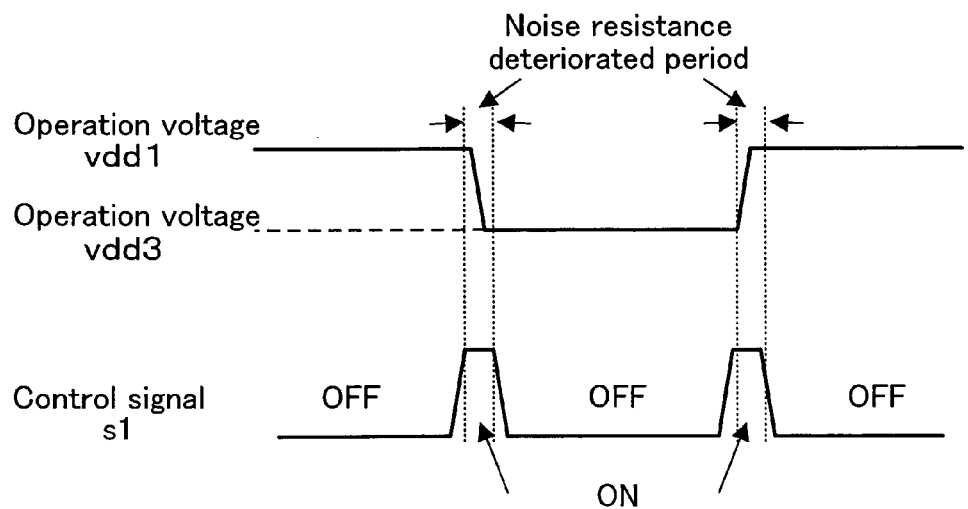
FIG. 6 is a diagram showing a third control example of the semiconductor integrated circuit according to the third embodiment.

FIG. 6 shows a third example of control of the latch circuit 1. The switching control circuit 41 detects switching from the operation voltage vdd1 to the operation voltage vdd3 in the latch circuit 1 and switching from the operation voltage vdd3 to the operation voltage vdd1 in the latch circuit 1, and the logical level of the control signal s1 is set at "H" during a period of switching of the operation voltages, so that the switching element is controlled to an ON state. In this manner, during the period of switching of the operation voltages in which noise resistance is deteriorated by an influence of coupling noise generated by a coupling capacitance parasitized in a portion receiving an operation voltage of the latch circuit, the capacitance of the storage node is increased to make it possible to stably hold data.

Fourth Embodiment

Figure 7:
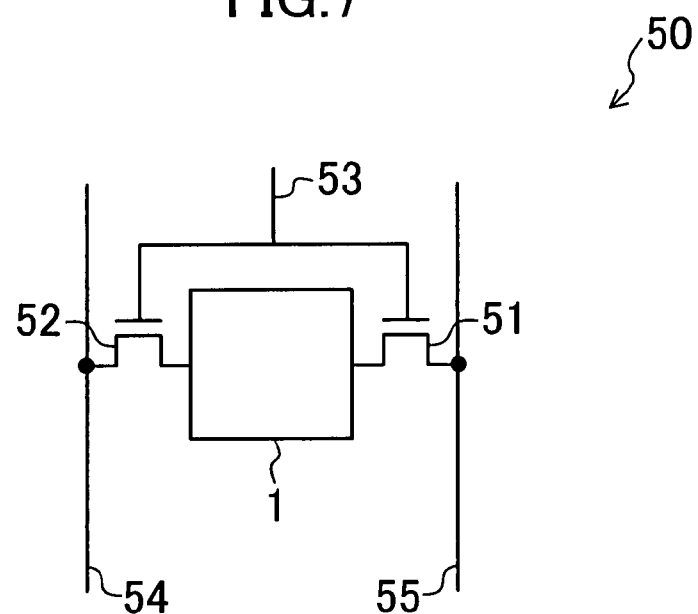
FIG. 7 is a diagram showing an example of configuration of an SRAM according to a fourth embodiment.

FIG. 7 shows an example of configuration of an SRAM according to a fourth embodiment. An SRAM cell 50 is a 6-transistor cell including the latch circuit 1, NMOS transistors 51 and 52, a word line 53 for data access, a digit line 54 for reading/writing data, and a digit line 55 paired with the digit line 54. The nMOS transistors 51 and 52 are connected to the storage nodes 19 and 20 of the latch circuit 1, respectively, to read and write data. Since the latch circuit according to the present invention can hold data stably more than a conventional latch circuit and can achieve a stable operation, the SRAM cell 50 can be stably operated.

Resistors may be used in place of the pMOS transistors in the inverter circuits 11 and 12 to constitute a 4-transistor cell.

Fifth Embodiment

Figure 8:
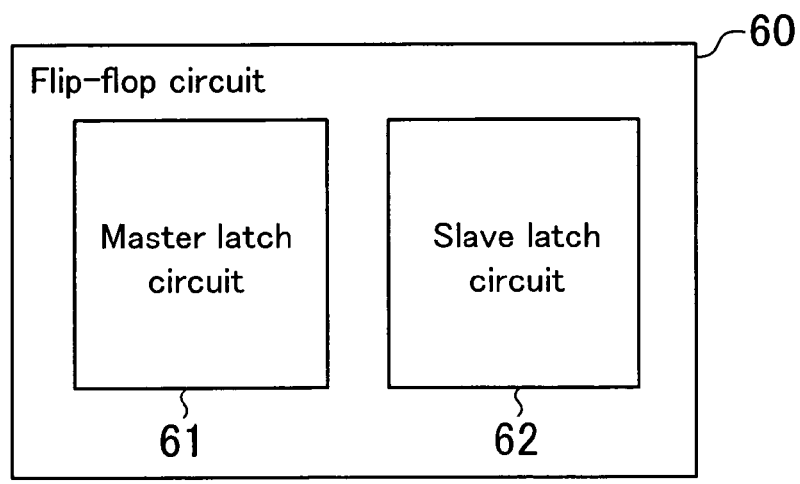
FIG. 8 is a diagram showing an example of configuration of a flip-flop circuit according to a fifth embodiment.

FIG. 8 is an example of configuration of a flip-flop circuit according to a fifth embodiment. A flip-flop circuit 60 includes a master latch circuit 61 and a slave latch circuit 62. One or both of the master latch circuit 61 and the slave latch circuit 62 are constituted by the latch circuits 1. The latch circuit according to the present invention can hold data stably more than a conventional latch circuit to achieve a stable operation, the flip-flop circuit 60 can also be stably operated. The configuration of the flip-flop circuit 60 is not limited to the above configuration. Another configuration can be applied.

(Application)

Figure 9:
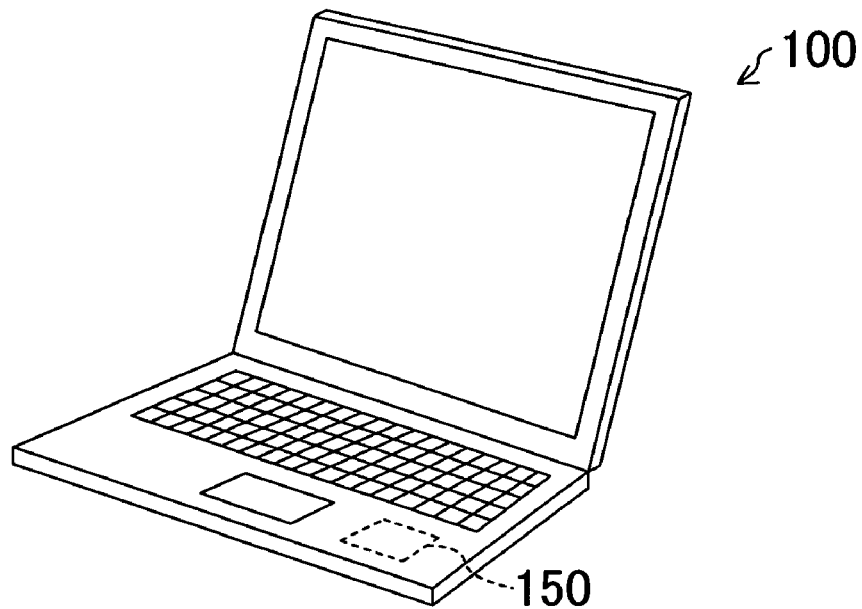
FIG. 9 is a schematic diagram of an information appliance having the latch circuit according to the present invention.

FIG. 9 shows an outline of an information appliance having the latch circuit according to the present invention. A notebook PC 100 includes a CPU 150 having the latch circuit 1. Since the latch circuit according to the present invention can hold data stably more than a conventional latch circuit to achieve a stable operation, the CPU 150 and the notebook PC 100 including the CPU 150 can also be stably operated, and the device is improved in reliability. The latch circuit according to the present invention can be generally applied to information appliances such as a personal digital assistant and a portable music player.

Figure 10:
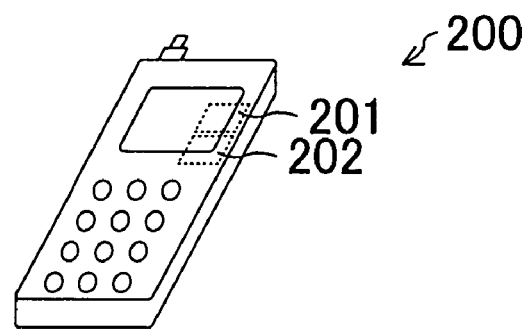
FIG. 10 is a schematic diagram of a communication appliance having the latch circuit according to the present invention.

FIG. 10 shows an outline of a communication appliance having the latch circuit according to the present invention. A mobile telephone 200 includes a baseband LSI 201 having the latch circuit 1 and an application LSI 202. Since the latch circuit according to the present invention can hold data stably more than a conventional latch circuit to achieve a stable operation, the baseband LSI 201, the application LSI 202, and the mobile telephone 200 including the baseband LSI 201 and the application LSI 202 can also be stably operated. The latch circuit according to the present invention can also be generally applied to communication appliances such as a transmitter, a receiver, and a modem device in a communication system. More specifically, according to the present invention, regardless of types of communications such as wired, wireless, optical, and electric communications, regardless of types of systems such as digital and analog systems, all communication appliances can be stably operated, and the device is improved in reliability.

Figure 11:
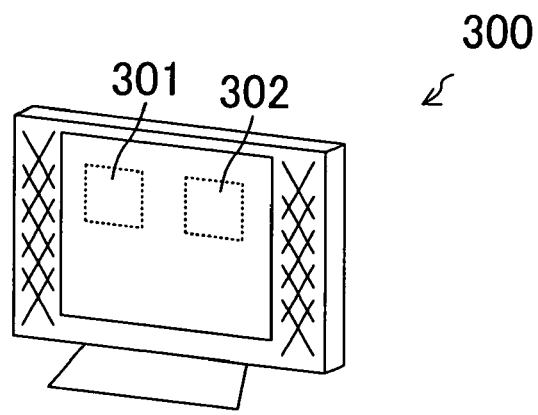
FIG. 11 is a schematic diagram of an AV appliance having the latch circuit according to the present invention.

FIG. 11 shows an outline of an AV appliance having the latch circuit according to the present invention. A television receiver 300 includes an image/sound processing LSI 301 having the latch circuit 1 and the display/sound-source control LSI 302. Since the latch circuit according to the present invention can hold data stably more than a conventional latch circuit to achieve a stable operation, the image/sound processing LSI 301, the display/sound-source control LSI 302, and the television receiver 300 including the image/sound processing LSI 301 and the display/sound-source control LSI 302 can be stably operated. The latch circuit according to the present invention can be generally applied to AV appliances such as an optical disk recording device, a digital still camera, and a digital video camera.

Figure 12:
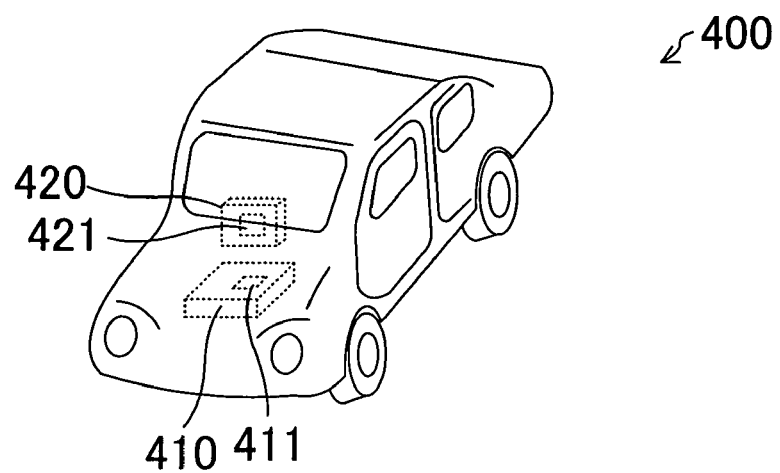
FIG. 12 is a schematic diagram of a mobile appliance having the latch circuit according to the present invention.

FIG. 12 shows an outline of a mobile appliance having the latch circuit according to the present invention. An automobile 400 includes an electronic control device 410. The electronic control device 410 includes an engine/transmission control LSI 411 having the latch circuit 1. The automobile 400 includes a navigation device 420. The navigation device 420 includes a navigation LSI 421 having the latch circuit 1. Since the latch circuit according to the present invention can hold data stably more than a conventional latch circuit to achieve a stable operation, the engine/transmission control LSI 411 and the electronic control device 410 including the engine/transmission control LSI 411 can also be stably operated. Similarly, the navigation LSI 421 and the navigation device 420 including the navigation LSI 421 can also be stably operated. When the electronic control device 410 is stably operated, the operation of the automobile 400 is stabilized, and the reliability of the automobile 400 is improved. The latch circuit according to the present invention can be applied to means of transportation in general such as trains and aircraft, which have therein driving sources such as engines and motors.

What is claimed is:

1. A latch circuit comprising:
   first and second inverter circuits cross-connected to each other;
   a third inverter circuit for receiving an output from the first inverter circuit to output a logically inverted value of the output;
   a switching element connected between an output terminal of the second inverter circuit and an output terminal of the third inverter circuit; and
   a capacitor element connected between the output terminal of the third inverter circuit and a constant reference voltage node.

2. The latch circuit according to claim 1, comprising:
   a fourth inverter circuit for receiving an output from the second inverter circuit to output a logically inverted value of the output;
   a switching element connected between the output terminal of the first inverter circuit and an output terminal of the fourth inverter circuit; and
   a capacitor element connected between the output terminal of the fourth inverter circuit and the constant reference voltage node.

3. The latch circuit according to claim 1, wherein the third inverter circuit is a tristate inverter circuit.

4. The latch circuit according to claim 1, wherein the switching element is a MOS transistor switch.

5. The latch circuit according to claim 1, wherein the switching element is a transfer gate.

6. The latch circuit according to claim 1, wherein the capacitor element is a trench capacitor element.

7. The latch circuit according to claim 1, wherein the capacitor element is a MOS capacitor.

8. A semiconductor integrated circuit including the latch circuit according to claim 1, wherein the capacitor element is arranged to fill an empty space in the semiconductor integrated circuit.

9. A semiconductor integrated circuit comprising:
   the latch circuit according to claim 1;
   a clock gate circuit for controlling the presence/absence of outputting of an input clock signal on the basis of a control signal; and
   an input control circuit for controlling the presence/absence of inputting of a data signal to the latch circuit in synchronism with an output signal from the clock gate circuit,
   wherein the switching element operates in response to the control signal.

10. A semiconductor integrated circuit comprising:
    the latch circuit according to claim 1; and
    a switching control circuit for controlling a switching operation of the switching element in synchronism with switching of operation frequencies of the latch circuit.

11. A semiconductor integrated device comprising:
    the latch circuit according to claim 1; and
    a switching control circuit for controlling a switching operation of the switching element in synchronism with switching of operation voltages of the latch circuit.

12. A semiconductor integrated circuit comprising:
    the latch circuit according to claim 1; and
    a switching control circuit for detecting switching of operation voltages applied to the latch circuit to control the switching element to an ON state during a switching period.

13. A static semiconductor memory comprising the latch circuit according to claim 1.

14. A master-slave-type flip-flop circuit comprising the latch circuit according to claim 1 as at least one of a master latch circuit and a slave latch circuit.

15. An information appliance comprising the latch circuit according to claim 1.

16. A communication appliance comprising the latch circuit according to claim 1.

17. An AV appliance comprising the latch circuit according to claim 1.

18. A mobile appliance comprising the latch circuit according to claim 1.

* * * * *